United States Patent [19]
Kishi

[11] Patent Number: 5,591,260
[45] Date of Patent: Jan. 7, 1997

[54] METHOD FOR CRYSTAL GROWTH

[75] Inventor: Tadahiko Kishi, Shiga, Japan

[73] Assignee: NEC Corporation, Tokyo, Japan

[21] Appl. No.: 302,009

[22] Filed: Sep. 9, 1994

[30] Foreign Application Priority Data

Sep. 20, 1993 [JP] Japan ................................. 5-232669

[51] Int. Cl.⁶ .................................................. C30B 25/02
[52] U.S. Cl. ........................ 117/104; 117/954; 437/107
[58] Field of Search .................................. 117/104, 105, 117/954; 437/107, 126

[56] References Cited

U.S. PATENT DOCUMENTS 4,937,204  6/1990  Ishibasha et al. ..................... 437/110

Primary Examiner—R. Bruce Breneman
Assistant Examiner—Felisa Garrett
Attorney, Agent, or Firm—Popham, Haik, Schnobrich & Kaufman, Ltd.

[57] ABSTRACT

The invention provides a method for growing GaAs crystals wherein GaAs crystal growth is carried out by means of an equipment by which Indium containing crystals were grown before carrying out the GaAs crystal growth, and the GaAs crystal growth is caused by thermal organic metal decomposition technique using trimethyl gallium as a source of gallium (Ga).

9 Claims, 3 Drawing Sheets

METHOD FOR CRYSTAL GROWTH

BACKGROUND OF THE INVENTION

1. Field of the Invention

The invention relates to a capable method of improving crystal quality of a chemical compound semiconductor device such as a visible semiconductor laser diode.

2. Description of the Related Art

A conventional method for forming crystals includes a vapor phase epitaxy process (MO-VPE) utilizing thermal organic metal decomposition. FIG. 1 illustrates crystal layers grown by the MO-VPE process. As illustrated, on an n-type GaAs substrate 1 are successively grown a n-type GaAs buffer layer 3, a n-type $(Al_x Ga_{1-x})_{0.5} In_{0.5} P$ clad layer 4 ($0<x\leq1$), a $Ga_{0.5} In_{0.5} P$ active layer 5, a p-type $(Al_x Ga_{1-x})_{0.5} In_{0.5} P$ clad layer 6 ($0<x\leq1$), a p-type $Ga_{0.5} In_{0.5} P$ hetero buffer layer 8, a n-type GaAs block layer 10, and a p-type GaAs contact layer 12. For instance, see Japanese Unexamined Patent Public Disclosure No. 3-53577.

However, the above mentioned conventional method has a problem. In the conventional method, when the n-type GaAs buffer layer 3, the n-type GaAs block layer 10 and the p-type GaAs contact layer 12 are to be grown, triethyl gallium (TEG) is used as a source of gallium (Ga). The use of TEG causes the generation of an intermediate product by a memory effect in the crystal growth equipment such as trimethyl indium (TMI) and triethyl indium (TEI) both of which are used as a source of indium (In) for $(Al_x Ga_{1-x})_{0.5} In_{0.5} P$ crystal growth ($0\leq X\leq1$). Thus, the indium (In) is incorporated into the GaAs layers, and they form InGaAs layers.

As illustrated in FIG. 2A, the thus formed InGaAs layers have a lattice constant J rather than a lattice constant I of a GaAs substrate, and produce a lattice mismatch between the GaAs substrate and $(Al_x Ga_{1-x})_{0.5} In_{0.5} P$ crystals ($0\leq X\leq1$) which have been formed so that they have the same lattice constant as that of the GaAs substrate.

If an electrical current is continuously applied to a semiconductor laser composed of such crystals having a lattice mismatch, there would be an increase in <110> dark line defects. As a result, as illustrated in FIG. 2B, the operating current is increased with the result that the semiconductor laser is degraded and finally no longer oscillates.

SUMMARY OF THE INVENTION

In view of the foregoing problems, it is an object of the present invention to provide a method for avoiding GaAs layers from turning into InGaAs layers while forming GaAs crystals.

In one aspect, the invention provides a method for GaAs crystal growth wherein GaAs crystal growth is carried out by means of equipment in which indium containing crystals were grown before carrying out the GaAs crystal growth, and the GaAs crystal growth is caused by the thermal organic metal decomposition technique using trimethyl gallium as a source of gallium (Ga).

In another aspect, the invention provides a method for crystal growth including the steps of forming a GaAs layer on a GaAs substrate by the thermal organic metal decomposition technique, forming indium containing crystals on top of the GaAs layer, and repeating the previous two steps with different substrates for every two steps. In the first step, trimethyl gallium is used as a source of gallium (Ga).

In still another aspect, the invention provides a method for crystal growth including the steps of forming crystals including indium on a GaAs substrate by the thermal organic metal decomposition technique, and forming a GaAs layer on top of the crystals. In the second step, trimethyl gallium is used as a source of gallium (Ga).

In yet another aspect, the invention provides a method for crystal growth having the steps of forming crystals including indium on a GaAs substrate by the thermal organic metal decomposition technique, and forming an $Al_y Ga_{1-y}$ As ($0.3<y<0.7$) layer on top of the crystals. In the second step, trimethyl gallium is used as a source of gallium (Ga).

In a preferred embodiment, the indium containing crystal is a Al-Ga-In-P crystal lattice which matches with the GaAs substrate.

In another preferred embodiment, the Al-Ga-In-P crystal is a $(Al_x Ga_{1-x})_{0.5} In_{0.5} P$ crystal ($0\leq X\leq1$).

More specifically, the invention may be applied to at least any one of a n-type GaAs buffer layer formed on a n-type GaAs substrate, a N-type GaAs block layer and a p-type GaAs contact layer, the latter two layers being to be formed on $(Al_x Ga_{1-x})_{0.5} In_{0.5} P$ crystals ($0\leq X\leq1$) formed on the n-type GaAs buffer layer. It is preferable to apply the invention to crystal forming steps after indium containing layers in the block or contact layers have been formed.

In addition, when a p-type $Al_y Ga_{1-y}$ As hetero buffer layer is to be used as a underlying layer of the n-type GaAs block layer, it is possible to obtain the same advantages as aforementioned by the use of TMG (trimethyl gallium) as a source of gallium for forming the GaAs layers.

The advantages obtained by the aforementioned present invention will be described hereinbelow.

In accordance with the invention, when the n-type GaAs buffer layer, the n-type GaAs block layer and the p-type GaAs contact layer are formed, the use of trimethyl gallium (TMG) does not cause the production of intermediate product due to a memory effect in the apparatus for forming crystals such as trimethyl indium (TMI) and triethyl indium (TEI) both of which are used for forming $(Al_x Ga_{1-x})_{0.5} In_{0.5} P$ crystals ($0\leq X\leq1$). Accordingly, the lattice constants of the N-type GaAs buffer layer, the n-type GaAs block layer and the p-type GaAs contact layer are kept consistent with the lattice constant of the GaAs substrate, and hence a lattice mismatch does not occur. Thus, it is possible to provide a highly reliable semiconductor laser diode which does not produce <110> dark line defects and hence is not degraded by such dark line defects, even if an electrical current is continuously applied to a semiconductor laser composed of the crystals formed by the method in accordance with the invention.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
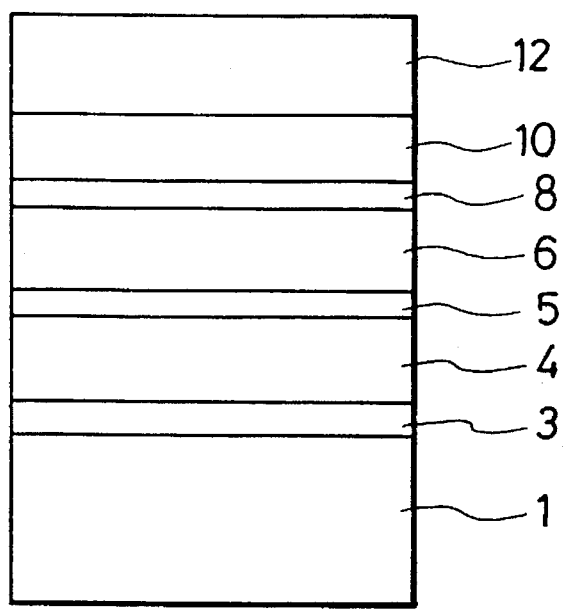
FIG. 1 is a cross-sectional view of a conventional crystal structure.
Figure 2A:
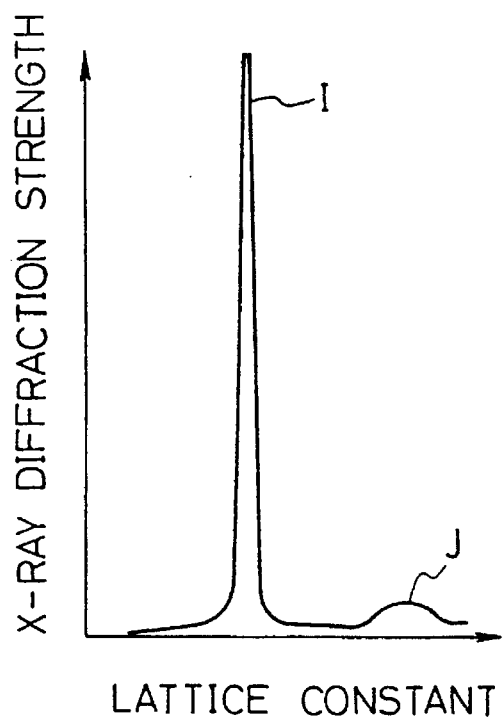
FIG. 2A is a graph illustrating a curve indicating X-ray diffraction strength of a conventional crystal structure.
Figure 2B:
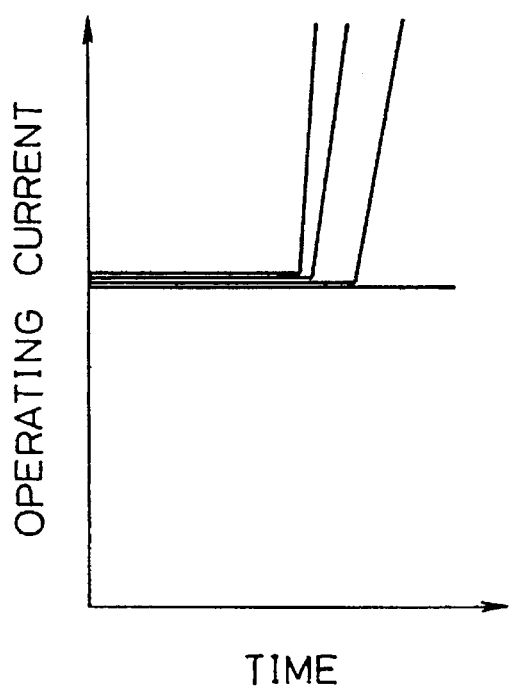
FIG. 2B is a graph showing the relationship between an operating current for controlling an output beam to be radiated from a semiconductor laser composed of the conventional crystal structure, and time.

Hereinbelow, parts or elements which have been already illustrated in FIG. 1 are provided with the same reference numbers as those in FIG. 1, and explanation of those parts or elements will be omitted.

EMBODIMENT 1

Figure 3:
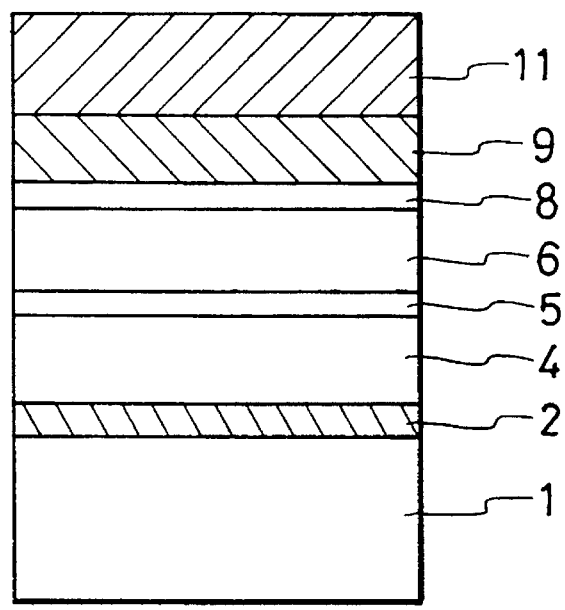
FIG. 3 is a cross-sectional view of a crystal structure in accordance with a first embodiment of the present invention.

FIG. 3 is a cross-sectional view illustrating a crystal structure in accordance with a first embodiment of the invention on the n-type GaAs substrate 1 is formed the n-type GaAs buffer layer 2 using TMG (trimethyl gallium) as a source of gallium. Further on the n-type GaAs buffer layer 2 are sequentially formed the n-type $(Al_x Ga_{1-x})_{0.5} In_{0.5}$ P clad layer 4 ($0 \leq x \leq 1$), the $Ga_{0.5} In_{0.5}$ P active layer 5, the p-type $(Al_x Ga_{1-x})_{0.5} In_{0.5}$ P clad layer 6 ($0 \leq x \leq 1$), and the p-type $Ga_{0.5} In_{0.5}$ P hetero buffer layer 8. By using trimethyl gallium (TMG) as a source of gallium in the n-type GaAs block layer 9 and the Ppp-type GaAs contact layer 11 to be formed on the buffer layer 8, each of the GaAs layers does not produce intermediate products in combination with TMI and TEI, which intermediate products could otherwise be produced due to a memory effect in the crystal forming apparatus. Accordingly, the lattice constants J of the n-type GaAs buffer layer 2, the N-type GaAs block layer 9 and the n-type GaAs contact layer 11 are consistent with the lattice constant I of the GaAs substrate, as illustrated in FIG. 4B.

Thus, continuous application of an electrical current to a semiconductor laser composed of the aforementioned crystals would not produce <110> dark line defects. Accordingly, an operating current as illustrated in FIG. 4B for controlling an output beam power of a semiconductor laser is kept stable, and hence would not be suddenly degraded.

EMBODIMENT 2

Figure 5:
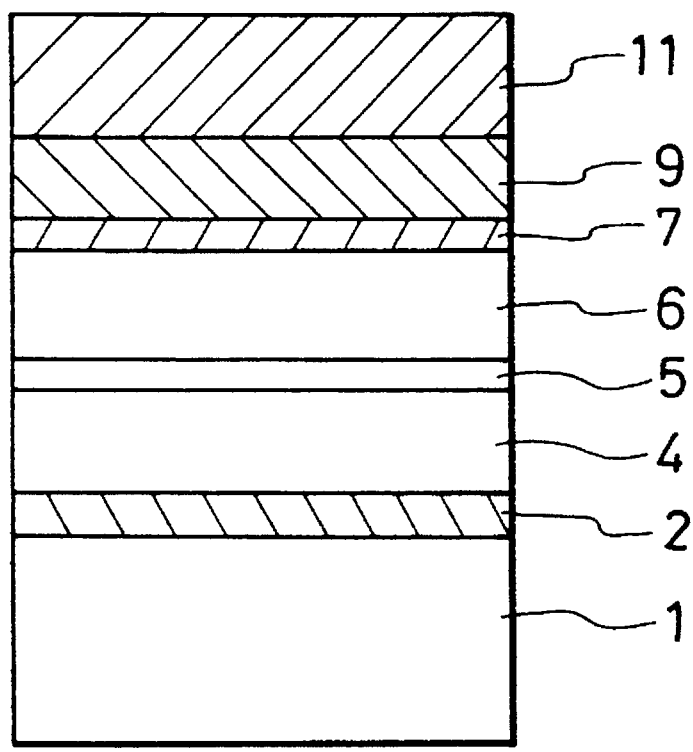
FIG. 5 is a cross-sectional view of a crystal structure in accordance with a second embodiment of the present invention.

FIG. 5 is a cross-sectional view illustrating a crystal structure in accordance with a second embodiment of the invention.

In the second embodiment, the p-type $Ga_{0.5} In_{0.5}$ P hetero buffer layer 8 in the first embodiment is replaced with a p-type $Al_y Ga_{1-y}$ As hetero buffer layer 7 ($0.3<y<0.7$) to thereby reduce valence band spikes in which a band of a so-called hetero interface is discontinuous, which valence band spike is generated in the p-type $(Al_x Ga_{1-x})_{0.5} In_{0.5}$ P clad layer 6 ($0 \leq x \leq 1$) and the n-type GaAs block layer 9 or the p-type GaAs contact layer 11 and a hetero interface.

Figure 4A:
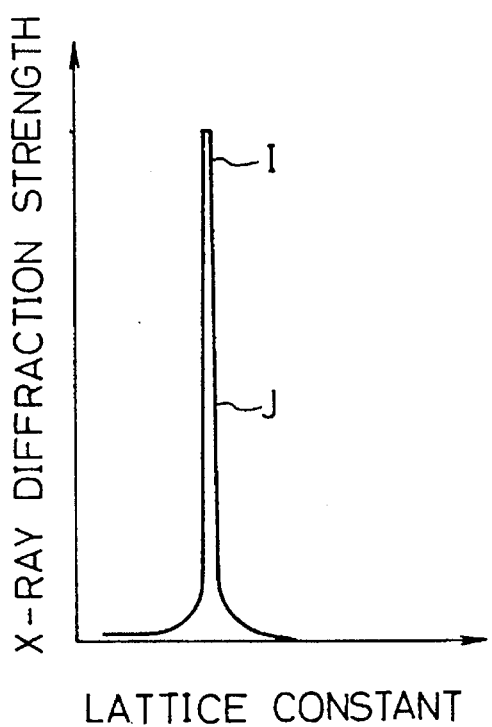
FIG. 4A is a graph illustrating a curve indicating X-ray diffraction strength of crystal structures formed in accordance with first and second embodiments of the present invention.
Figure 4B:
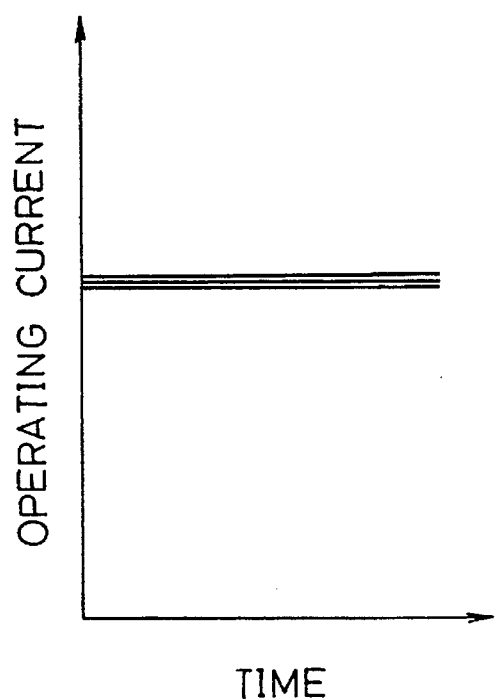
FIG. 4B is a graph showing the relationship between an operating current for controlling an output beam power to be radiated from a semiconductor laser composed of the crystal structures formed in accordance with first and second embodiments of the present invention, and time.

By using trimethyl gallium as a source of gallium (Ga) in the p-type $Al_y Ga_{1-y}$ As hetero buffer layer 7 ($0.3<y<0.7$), and further in the n-type GaAs block layer 9 and the p-type GaAs contact layer 11 similarly to the first embodiment, the lattice constants J of the P-type $Al_y Ga_{1-y}$ As hetero buffer layer 7 ($0.3<y<0.7$), the n-type GaAs block layer 9 and the n-type GaAs contact layer 11 are consistent with the lattice constant of the GaAs substrate, as illustrated in FIG. 4A.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method for growing crystals comprising the steps of:
   forming crystals including an indium containing crystal layer on a GaAs substrate by a thermal organic metal decomposition technique using trimethyl indium or triethyl indium as a source of indium; and
   forming an $Al_y Ga_{1-y}$ As ($0.3<y<0.7$) layer on top of said crystals,
   trimethyl gallium being used as a source of gallium (Ga) in the second step.

2. A method in accordance with claim 1, wherein said indium containing crystal has a Al-Ga-In-P crystal lattice which matches with a GaAs substrate.

3. A method in accordance with claim 2, wherein said Al-Ga-In-P crystal comprises a $(Al_x Ga_{1-x})_{0.5} In_{0.5}$ P crystal ($0 \leq X \leq 1$).

4. A method for growing crystals comprising the steps of:
   forming crystals including an indium containing crystal layer on a GaAs substrate by a thermal organic metal decomposition technique using trimethyl indium or triethyl indium as a source of indium; and
   forming a GaAs layer on top of said crystals,
   trimethyl gallium being used as a source of gallium (Ga) in the step of forming a GaAs layer.

5. A method in accordance with claim 4, wherein said indium containing crystal has a Al-Ga-In-P crystal lattice which matches with a GaAs substrate.

6. A method in accordance with claim 5, wherein said Al-Ga-In-P crystal comprises a $(Al_x Ga_{1-x})_{0.5} In_{0.5}$ P crystal ($0 \leq X \leq 1$).

7. A method for growing crystals onto multiple GaAs substrates comprising the steps of:
   forming a first GaAs layer on a first GaAs substrate by a thermal organic metal decomposition technique using trimethyl gallium as a source of gallium,
   forming first indium containing crystals on top of said GaAs layer, and
   repeating said forming steps with different substrates by:
   forming a second GaAs layer on a second GaAs substrate by a thermal organic metal decomposition technique using trimethyl gallium as a source of gallium, and
   forming second indium containing crystals on top of said second GaAs layer.

8. A method in accordance with claim 7, wherein said indium containing crystal has a Al-Ga-In-P crystal lattice which matches with a GaAs substrate.

9. A method in accordance with claim 8, wherein said Al-Ga-In-P crystal comprises a $(Al_x Ga_{1-x})_{0.5} In_{0.5}$ P crystal ($0 \leq X \leq 1$).

* * * * *